US012588508B2

(12) United States Patent
Yu et al.

(10) Patent No.: US 12,588,508 B2
(45) Date of Patent: Mar. 24, 2026

(54) PACKAGE COMPRISING A LID STRUCTURE WITH A COMPARTMENT

(71) Applicant: QUALCOMM Incorporated, San Diego, CA (US)

(72) Inventors: Youmin Yu, Escondido, CA (US); Wei Wu, Irvine, CA (US); Guoping Xu, San Diego, CA (US); Nader Nikfar, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 487 days.

(21) Appl. No.: 18/085,284

(22) Filed: Dec. 20, 2022

(65) Prior Publication Data

US 2024/0203820 A1    Jun. 20, 2024

(51) Int. Cl.
*H10W 40/70*        (2026.01)
*H10W 70/685*       (2026.01)
*H10W 76/12*        (2026.01)
*H10W 90/00*        (2026.01)

(52) U.S. Cl.
CPC ......... *H10W 40/70* (2026.01); *H10W 70/685* (2026.01); *H10W 76/161* (2026.01); *H10W 90/00* (2026.01)

(58) Field of Classification Search
CPC . H01L 23/42; H01L 23/041; H01L 23/49822; H01L 23/49816; H01L 23/5385; H01L 23/3736; H01L 23/3675; H01L 23/552; H01L 25/165; H10W 40/70; H10W 70/685; H10W 76/161; H10W 90/00
See application file for complete search history.

(56) References Cited

U.S. PATENT DOCUMENTS

| | | | | |
|---|---|---|---|---|
| 11,424,155 | B2 * | 8/2022 | Kelly | ...................... H01L 25/50 |
| 2007/0200209 | A1 * | 8/2007 | Fukuzono | ............... H01L 23/42 |
| | | | | 257/E23.087 |
| 2017/0186665 | A1 * | 6/2017 | Choudhury | ......... H01L 23/3675 |
| 2023/0037617 | A1 * | 2/2023 | Zheng | ................... H01L 23/367 |
| 2024/0186213 | A1 * | 6/2024 | Ree | ..................... H01L 23/3735 |
| 2024/0203803 | A1 * | 6/2024 | Kim | ...................... H01L 23/053 |

FOREIGN PATENT DOCUMENTS

| | | |
|---|---|---|
| EP | 0449640 A1 | 10/1991 |
| WO | 2021217319 A1 | 11/2021 |

OTHER PUBLICATIONS

International Search Report and Written Opinion—PCT/US2023/080964—ISA/EPO—Mar. 28, 2024.

* cited by examiner

*Primary Examiner* — Omar F Mojaddedi
(74) *Attorney, Agent, or Firm* — Loza & Loza, LLP

(57)                ABSTRACT

A package comprising a substrate, a first integrated device coupled to a first surface of the substrate, a lid structure coupled to the substrate, where the lid structure includes a first compartment comprising a side surface and an inner top surface, and a thermal interface material coupled to (i) the first integrated device and (ii) the side surface and the inner top surface of the first compartment of the lid structure. The substrate includes at least one dielectric layer and a plurality of interconnects.

17 Claims, 10 Drawing Sheets

*CROSS SECTIONAL PROFILE VIEW*

CROSS SECTIONAL PROFILE VIEW

CROSS SECTIONAL PROFILE VIEW

CROSS SECTIONAL PROFILE VIEW

BOTTOM ANGLED VIEW

CROSS SECTIONAL PROFILE VIEW

BOTTOM ANGLED VIEW

*JUNCTION TEMPERATURE*
*MAP PROFILE OF INTEGRATED DEVICE WITH*
*LID STRUCTURE COMPRISING CAVITY*

*JUNCTION TEMPERATURE*
*MAP PROFILE OF INTEGRATED DEVICE WITH*
*LID STRUCTURE WITHOUT CAVITY*

STRESS MAP PROFILE OF THERMAL INTERFACE
MATERIAL COUPLED TO INTEGRATED DEVICE
AND LID STRUCTURE COMPRISING CAVITY

STRESS MAP PROFILE OF THERMAL INTERFACE
MATERIAL COUPLED TO INTEGRATED DEVICE
AND LID STRUCTURE WITHOUT CAVITY

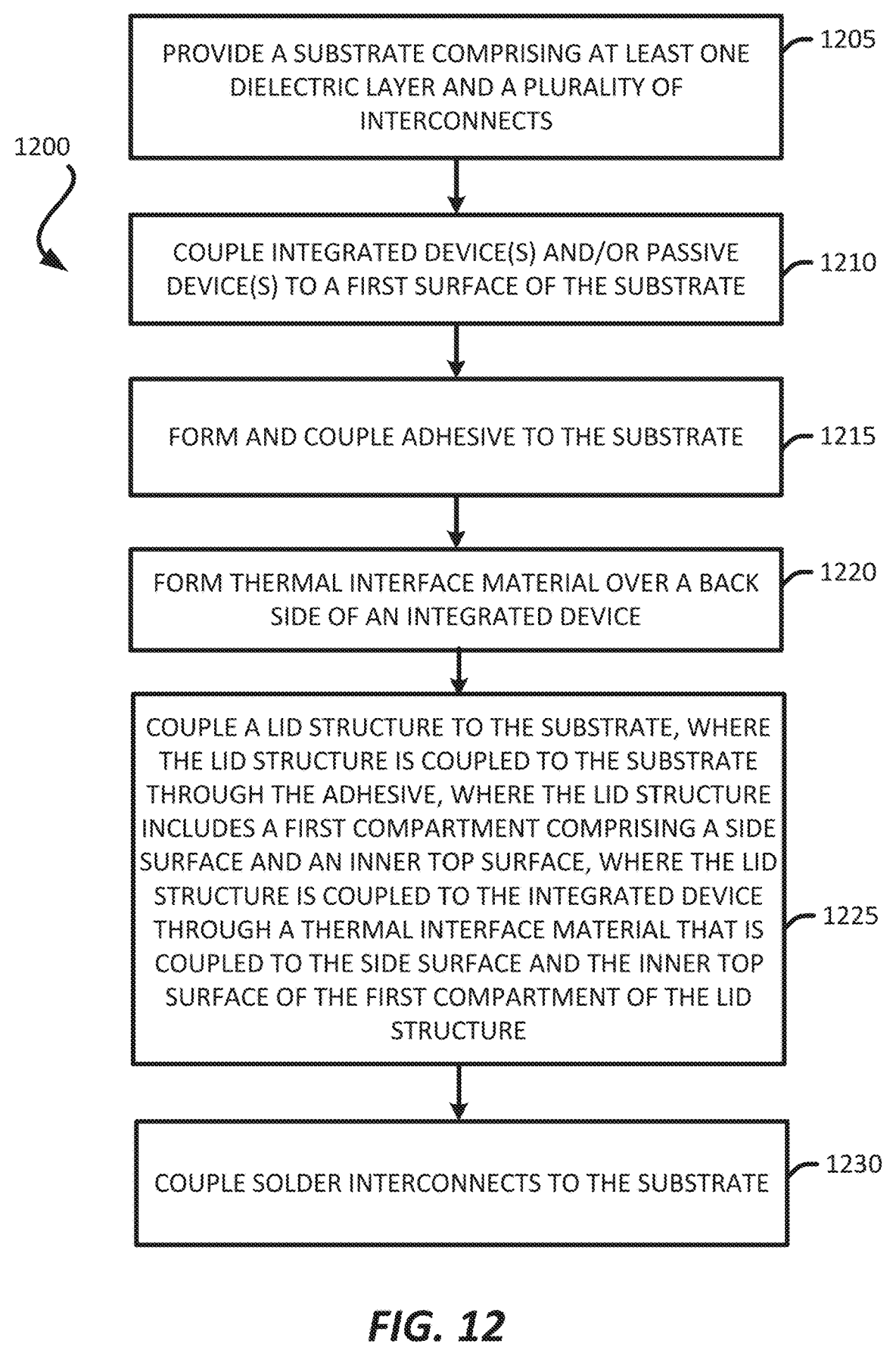

1200

PROVIDE A SUBSTRATE COMPRISING AT LEAST ONE DIELECTRIC LAYER AND A PLURALITY OF INTERCONNECTS — 1205

COUPLE INTEGRATED DEVICE(S) AND/OR PASSIVE DEVICE(S) TO A FIRST SURFACE OF THE SUBSTRATE — 1210

FORM AND COUPLE ADHESIVE TO THE SUBSTRATE — 1215

FORM THERMAL INTERFACE MATERIAL OVER A BACK SIDE OF AN INTEGRATED DEVICE — 1220

COUPLE A LID STRUCTURE TO THE SUBSTRATE, WHERE THE LID STRUCTURE IS COUPLED TO THE SUBSTRATE THROUGH THE ADHESIVE, WHERE THE LID STRUCTURE INCLUDES A FIRST COMPARTMENT COMPRISING A SIDE SURFACE AND AN INNER TOP SURFACE, WHERE THE LID STRUCTURE IS COUPLED TO THE INTEGRATED DEVICE THROUGH A THERMAL INTERFACE MATERIAL THAT IS COUPLED TO THE SIDE SURFACE AND THE INNER TOP SURFACE OF THE FIRST COMPARTMENT OF THE LID STRUCTURE — 1225

COUPLE SOLDER INTERCONNECTS TO THE SUBSTRATE — 1230

*FIG. 12*

PACKAGE COMPRISING A LID STRUCTURE WITH A COMPARTMENT

FIELD

Various features relate to packages with an integrated device and a lid structure.

BACKGROUND

A package may include a substrate and integrated devices. These components are coupled together to provide a package that may perform various functions. The performance of a package and its components may depend on how these components are coupled together. An integrated device generates heat, and too much heat can negatively impact the performance of the integrated device and/or the package. There is an ongoing need to have a package and/or an integrated device with improved thermal performance.

SUMMARY

Various features relate to packages with an integrated device and a lid structure.

One example provides a package comprising a substrate, a first integrated device coupled to a first surface of the substrate, a lid structure coupled to the substrate, where the lid structure includes a first compartment comprising a side surface and an inner top surface, and a thermal interface material coupled to (i) the first integrated device and (ii) the side surface and the inner top surface of the first compartment of the lid structure. The substrate includes at least one dielectric layer and a plurality of interconnects.

Another example provides a device that includes a package. The package comprises a substrate, a first integrated device coupled to a first surface of the substrate, a lid structure coupled to the substrate, where the lid structure includes a first compartment comprising a side surface and an inner top surface, and a thermal interface material coupled to (i) the first integrated device and (ii) the side surface and the inner top surface of the first compartment of the lid structure. The substrate includes at least one dielectric layer and a plurality of interconnects.

Another example provides a method for fabricating a package. The method provides a substrate that includes at least one dielectric layer and a plurality of interconnects. The method couples a first integrated device to a first surface of the substrate. The method couples a lid structure to the substrate, where the lid structure includes a first compartment comprising a side surface and an inner top surface. The coupling of the lid structure comprises coupling the lid structure to the first integrated device through a thermal interface material. The thermal interface material is coupled to the side surface and the inner top surface of the first compartment of the lid structure.

BRIEF DESCRIPTION OF THE DRAWINGS

Various features, nature and advantages may become apparent from the detailed description set forth below when taken in conjunction with the drawings in which like reference characters identify correspondingly throughout.

FIG. 12 illustrates an exemplary flow diagram of a method for fabricating a package that includes an integrated device and a lid structure with a compartment.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a package that includes a substrate, a first integrated device coupled to a first surface of the substrate, a lid structure coupled to the substrate, where the lid structure includes a first compartment comprising a side surface and an inner top surface, and a thermal interface material coupled to the first integrated device and the first compartment of the lid structure. The thermal interface material is coupled to the side surface and the inner top surface of the first compartment of the lid structure. The substrate includes at least one dielectric layer and a plurality of interconnects. The use of the first compartment in the lid structure helps improve heat dissipation from the integrated device to the lid structure through the thermal interface material. As will be further described below, the side surface of the lid structure helps compress the thermal interface material which in turns improves the effectiveness of the thermal interface material in dissipating heat from the integrated device to the lid structure. The improved heat dissipation can lead to improved performances for the integrated device and/or the package.

Exemplary Package Comprising a Lid Structure With a Compartment

Figure 1:
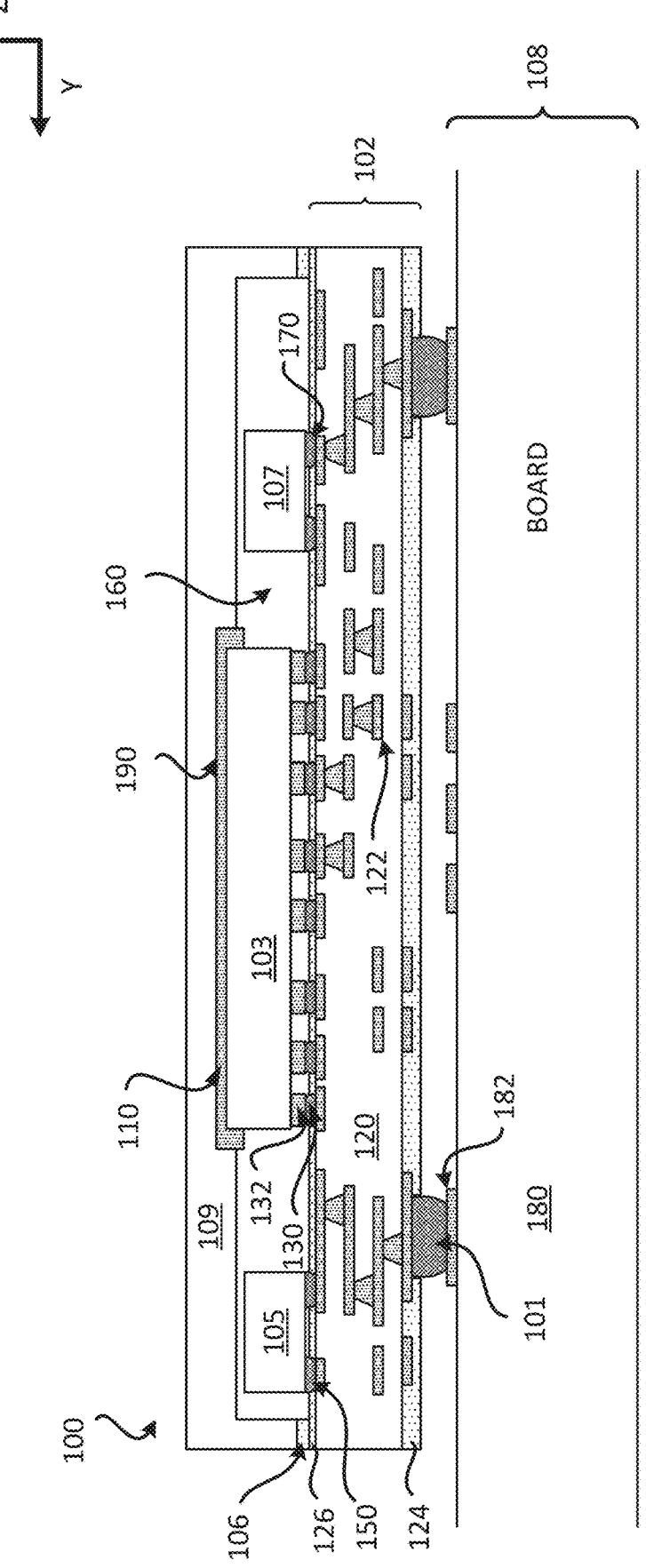
FIG. 1 illustrates a profile cross sectional view of an exemplary package that includes an integrated device and a lid structure with a compartment.

FIG. 1 illustrates a profile cross sectional view of a package 100 that includes a lid structure with at least one compartment. The package 100 includes a substrate 102, an integrated device 103, a passive device 105, an adhesive 106, a passive device 107, a lid structure 109 and a thermal interface material 110.

The package 100 is coupled to a board 108 (e.g., printed circuit board) through a plurality of solder interconnects 101. The board 108 includes at least one board dielectric layer 180 and a plurality of board interconnects 182. The package 100 is coupled to the plurality of board interconnects 182 of the board 108 (e.g., printed circuit board) through the plurality of solder interconnects 101.

The substrate 102 includes a first surface (e.g., top surface) and a second surface (e.g., bottom surface). The substrate 102 includes at least one dielectric layer 120 and a plurality of interconnects 122 (e.g., plurality of substrate interconnects). The at least one dielectric layer 120 may include prepreg. In some implementations, the first surface of the substrate 102 includes a solder resist layer 126 and the second surface of the substrate 102 includes a solder resist layer 124. The substrate 102 may be a laminate substrate. Different implementations may use different types of substrates. Different implementations may use different at least one dielectric layer 120.

The integrated device 103 is coupled to the first surface (e.g., top surface) of the substrate 102 through a plurality of solder interconnects 130. For example, the integrated device 103 is coupled to the substrate 102 through a plurality of pillar interconnects 132 and the plurality of solder interconnects 130. The plurality of solder interconnects 130 may be coupled to one or more interconnects from the plurality of interconnects 122. The integrated device 103 includes a front side and a back side. The front side of the integrated device 103 faces the substrate 102.

The passive device 105 is coupled to the first surface of the substrate 102 through a plurality of solder interconnects 150. The passive device 105 may be a capacitor and/or an inductor. The passive device 105 may be a discrete passive device. The passive device 107 is coupled to the first surface of the substrate 102 through a plurality of solder interconnects 170. The passive device 107 may be a capacitor and/or an inductor. The passive device 107 may be a discrete passive device.

The lid structure 109 is coupled to the first surface of the substrate 102 through the adhesive 106. The lid structure 109 includes a top portion and a footing portion (e.g., footing). Examples of a top portion and a footing portion of the lid structure 109 are described in further details below in at least FIGS. 3-4. The footing portion of the lid structure 109 is located over a periphery portion of the substrate 102. The adhesive 106 is coupled to the footing portion of the lid structure 109 and the substrate 102. The lid structure 109 may include metal. The lid structure 109 is configured to provide heat dissipation for the integrated device 103 through the thermal interface material 110. For example, heat generated at the integrated device 103 may dissipate through the thermal interface material 110 and the lid structure 109. The lid structure 109 may be configured as an electromagnetic interference (EMI) shield for the package 100 and/or the integrated device 103.

The lid structure 109 includes a compartment 190 (e.g., first compartment). The compartment 190 may include a cavity in the lid structure 109. For example, the compartment 190 may be a cavity in the top portion of the lid structure 109. The compartment 190 is located over the integrated device 103. The thermal interface material 110 may be located in the compartment 190 of the lid structure 109. The thermal interface material 110 may be coupled to the integrated device 103 and the lid structure 109. The thermal interface material 110 may be coupled to the back side of the integrated device 103 and the side surface of the integrated device 103. The thermal interface material 110 may be coupled to surfaces of the compartment 190 of the lid structure 109. For example, the thermal interface material 110 may be coupled to a side surface of the compartment 190 of the lid structure 109 (e.g., coupled to a side surface of the lid structure 109) and the inner top surface of the compartment 190. In some implementations, a portion of the integrated device 103 may be located in the compartment 190 of the lid structure 109. The compartment 190 may include the thermal interface material 110 and portions of the integrated device 103. In some implementations, the integrated device 103 is the only integrated device and/or passive device that is located in the compartment 190. The side surface of the compartment 190 may laterally surround a portion of the integrated device 103 and/or the thermal interface material 110. For example, the side surface of the compartment 190 may only laterally surround a portion of the integrated device 103 and/or the thermal interface material 110. However, it should be noted that a compartment 190 that only laterally surrounds a portion of the integrated device 103 and/or the thermal interface material 110 may laterally surround gas (e.g., air) that may be present in the compartment 190. The thermal interface material 110 is a material that is used to enhance and/or improve the thermal coupling between two or more components. In the example of FIG. 1, the thermal interface material 110 is used to improve the thermal coupling between the integrated device 103 and the lid structure 109. Different implementations may use different thermal interface materials. A thermal interface material may include a thermal paste, a thermal adhesive, a thermal filler and/or a thermal tape. A thermal interface material is a material that is thermally conductive.

As will be further described below, the use of the compartment 190 helps improve the compression of the thermal interface material 110, which helps lower the thermal resistance of the thermal interface material 110 and helps improve the heat transfer capabilities of the thermal interface material 110.

The coupling of the lid structure 109 to the substrate 102 may form another compartment 160 (e.g., second compartment). The compartment 160 may be a space defined by at least the lid structure 109 and the substrate 102. The integrated device 103, the passive device 105 and the passive device 107 may be located in the compartment 160 (e.g., may be located in the space defined by at least the lid structure 109 and the substrate 102). The footing portion (e.g., footing) of the lid structure 109 may laterally surround the integrated device 103, the passive device 105 and the passive device 107.

Figure 2:
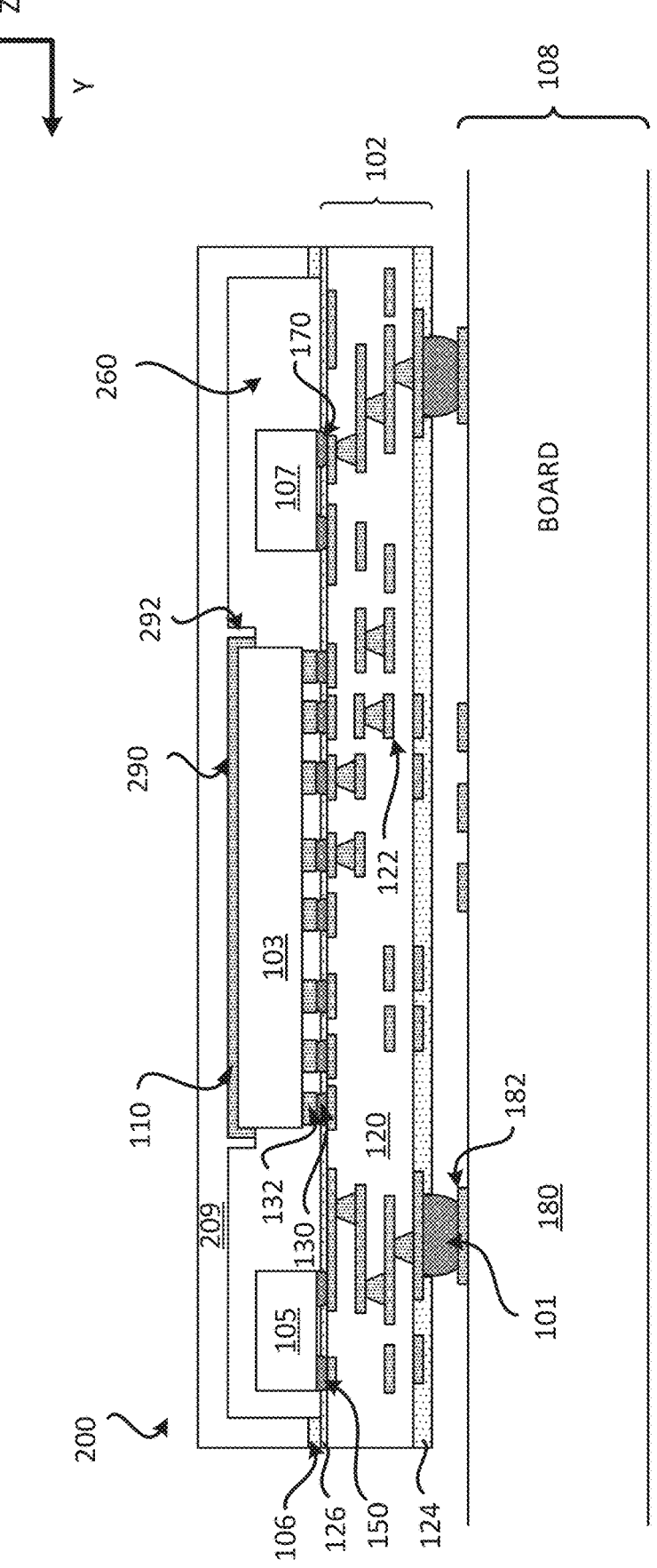
FIG. 2 illustrates a profile cross sectional view of an exemplary package that includes an integrated device and a lid structure with a compartment.

FIG. 2 illustrates a profile cross sectional view of a package 200 that includes a lid structure with at least one compartment. The package 200 includes the substrate 102, the integrated device 103, the passive device 105, the adhesive 106, the passive device 107, a lid structure 209 and the thermal interface material 110. The package 200 is similar to the package 100. However, in FIG. 2, the package 200 include a lid structure with a different design than the lid structure of FIG. 1.

The package 200 is coupled to the board 108 (e.g., printed circuit board) through the plurality of solder interconnects 101. The board 108 includes at least one board dielectric layer 180 and the plurality of board interconnects 182. The package 200 is coupled to the plurality of board interconnects 182 of the board 108 (e.g., printed circuit board) through the plurality of solder interconnects 101.

The substrate 102 includes a first surface (e.g., top surface) and a second surface (e.g., bottom surface). The substrate 102 includes at least one dielectric layer 120 and a plurality of interconnects 122 (e.g., plurality of substrate interconnects). The at least one dielectric layer 120 may include prepreg. In some implementations, the first surface of the substrate 102 includes a solder resist layer 126 and the second surface of the substrate 102 includes a solder resist layer 124. The substrate 102 may be a laminate substrate. Different implementations may use different types of substrates.

The integrated device 103 is coupled to the first surface (e.g., top surface) of the substrate 102 through a plurality of solder interconnects 130. For example, the integrated device 103 is coupled to the substrate 102 through a plurality of pillar interconnects 132 and the plurality of solder interconnects 130. The plurality of solder interconnects 130 may be coupled to one or more interconnects from the plurality of interconnects 122. The integrated device 103 includes a front side and a back side. The front side of the integrated device 103 faces the substrate 102.

The passive device 105 is coupled to the first surface of the substrate 102 through the plurality of solder interconnects 150. The passive device 105 may be a capacitor and/or an inductor. The passive device 105 may be a discrete passive device. The passive device 107 is coupled to the first surface of the substrate 102 through the plurality of solder interconnects 170. The passive device 107 may be a capacitor and/or an inductor. The passive device 107 may be a discrete passive device.

The lid structure 209 is coupled to the first surface of the substrate 102 through the adhesive 106. The lid structure 209 includes a top portion and a footing portion (e.g., footing). Examples of a top portion and a footing portion (e.g., footing) of the lid structure 209 are described in further details below in at least FIGS. 5-6. The footing portion of the lid structure 209 is located over a periphery portion of the substrate 102. The adhesive 106 is coupled to the footing portion of the lid structure 209 and the substrate 102. In some implementations, the adhesive 106 may be coupled to the solder resist layer 126. In some implementations, the adhesive 106 may be coupled to a dielectric layer of the substrate 102. The lid structure 209 may include metal. The lid structure 209 is configured to provide heat dissipation for the integrated device 103 through the thermal interface material 110. For example, heat generated at the integrated device 103 may dissipate through the thermal interface material 110 and the lid structure 209. The lid structure 209 may be configured as an electromagnetic interference (EMI) shield for the package 200 and/or the integrated device 103.

The lid structure 209 includes at least one protrusion 292 and a compartment 290 (e.g., first compartment). The at least one protrusion 292 may extend from the top portion of the lid structure 209. The compartment 290 may be defined by the at least one protrusion 292. The at least one protrusion 292 may define the side surfaces and/or the side walls of the compartment 290. The at least one protrusion 292 may be one continuous portion and/or contiguous portion. The at least one protrusion 292 may be several protrusions. The at least one protrusion 292 may be defined by several protrusions with gaps and/or spacing between neighboring protrusions. The at least one protrusion 292 may be configured to form boundaries of the compartment 290. The at least one protrusion 292 may extend towards the substrate 102. The compartment 290 is located over the integrated device 103.

The thermal interface material 110 may be located in the compartment 290 of the lid structure 209. The thermal interface material 110 may be coupled to the integrated device 103 and the lid structure 209. The thermal interface material 110 may be coupled to the back side of the integrated device 103 and the side surface of the integrated device 103. The thermal interface material 110 may be coupled to surfaces of the compartment 290 of the lid structure 209. For example, the thermal interface material 110 may be coupled to a side surface of the compartment 290 of the lid structure 109 (e.g., coupled to a side surface of the at least one protrusion 292) and the inner top surface of the compartment 290. In some implementations, a portion of the integrated device 103 may be located in the compartment 290 of the lid structure 209. The compartment 290 may include the thermal interface material 110 and portions of the integrated device 103. In some implementations, the integrated device 103 is the only integrated device and/or passive device that is located in the compartment 290. The side surface of the compartment 290 may laterally surround a portion of the integrated device 103 and/or the thermal interface material 110. For example, the at least one protrusion 292 may only laterally surround a portion of the integrated device 103 and/or the thermal interface material 110. However, it should be noted that the at least one protrusion 292 that only laterally surrounds a portion of the integrated device 103 and/or the thermal interface material 110 may laterally surround gas (e.g., air) that may be present.

As will be further described below, the use of the compartment 290 helps improve the compression of the thermal interface material 110, which helps lower the thermal resistance of the thermal interface material 110 and helps improve the heat transfer capabilities of the thermal interface material 110.

The coupling of the lid structure 209 to the substrate 102 may form another compartment 260. The compartment 260 may be a space defined by at least the lid structure 209 and the substrate 102. The integrated device 103, the passive device 105 and the passive device 107 may be located in the compartment 260 (e.g., may be located in the space defined by at least the lid structure 209 and the substrate 102). The footing portion (e.g., footing) of the lid structure 209 may laterally surround the integrated device 103, the passive device 105 and the passive device 107.

Figures 3, 4:
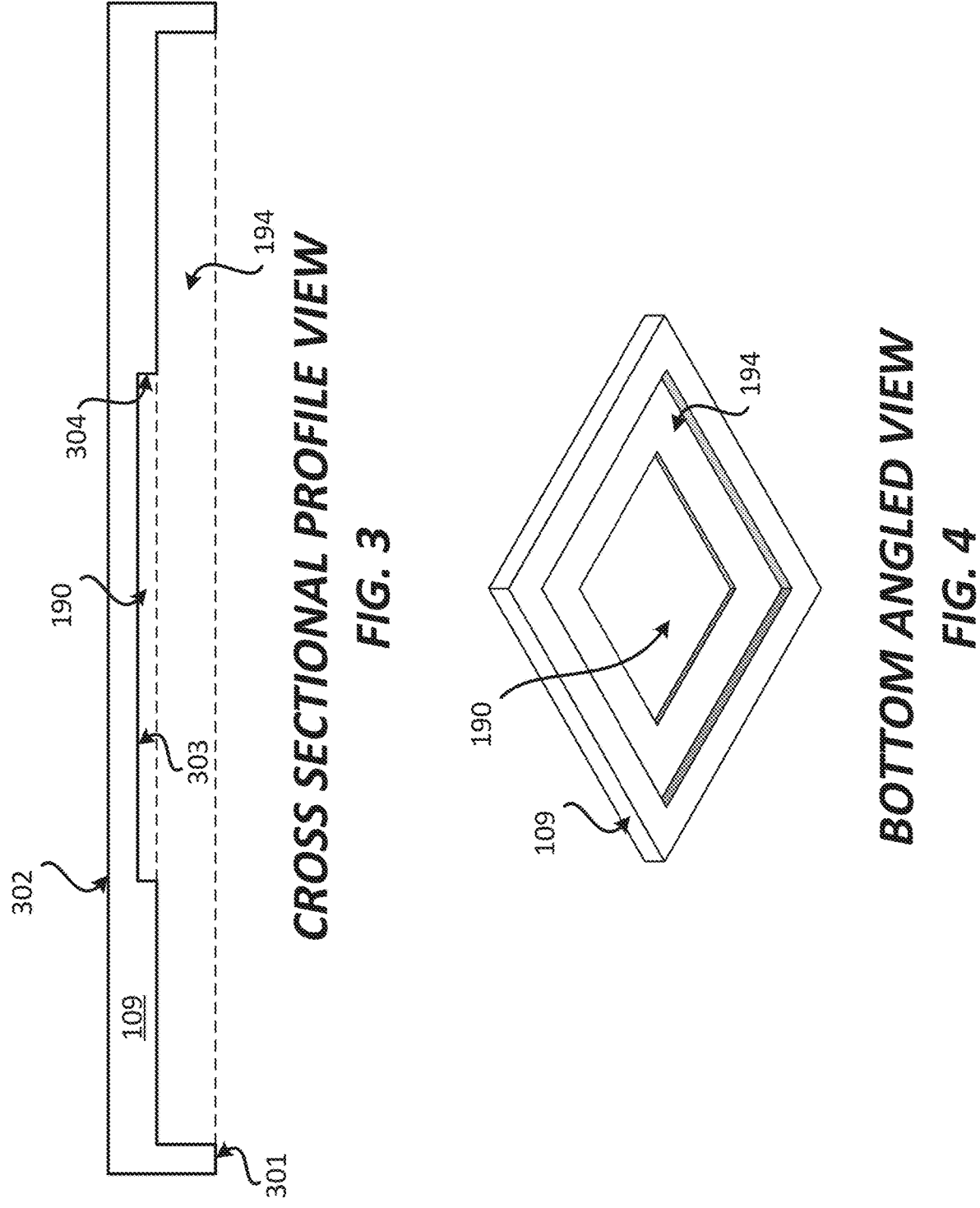
FIG. 3 illustrates a profile cross sectional view of an exemplary lid structure with a compartment.
FIG. 4 illustrates a view of an exemplary lid structure with a compartment.

FIG. 3 illustrates an exemplary profile view of the lid structure 109. The lid structure 109 includes a footing portion 301 and a top portion 302. The lid structure 109 also includes the compartment 190. The compartment 190 is defined by an inner top surface 303 and an inner side surface 304 (e.g., side surface). The inner top surface 303 and the inner side surface 304 may be located in the top portion 302 of the lid structure 109. The compartment 190 (e.g., first compartment) may include a cavity that is defined by the inner top surface 303 and the inner side surface 304 of the lid structure 109. FIG. 3 also illustrates a compartment 194. The compartment 194 (e.g., second compartment) may be a space that is defined by at least the footing portion 301 (e.g., footing) of the lid structure 109. The compartment 190 may be located over the compartment 194. The compartment 190 may be configured to include a thermal interface material (e.g., 110) such that thermal interface material is coupled to the inner top surface 303 and the inner side surface 304.

The use of the compartment 190 helps improve the compression of the thermal interface material 110, which helps lower the thermal resistance of the thermal interface material 110 and helps improve the heat transfer capabilities of the thermal interface material 110. For example, the inner side surface 304 helps provide additional compression on the thermal interface material between the integrated device (e.g., 103) and the lid structure 109, which helps reduce the thermal resistance of the thermal interface material and helps increase the heat transfer capabilities of the thermal interface material between the integrated device and the lid structure.

FIG. 4 illustrates an exemplary angled view of the lid structure 109. FIG. 4 illustrates the lid structure 109 from a bottom angle and/or an inner angle. The lid structure 109 includes the compartment 190 and the compartment 194. The compartment 194 may correspond and/or be similar to the compartment 160.

Figures 5, 6:
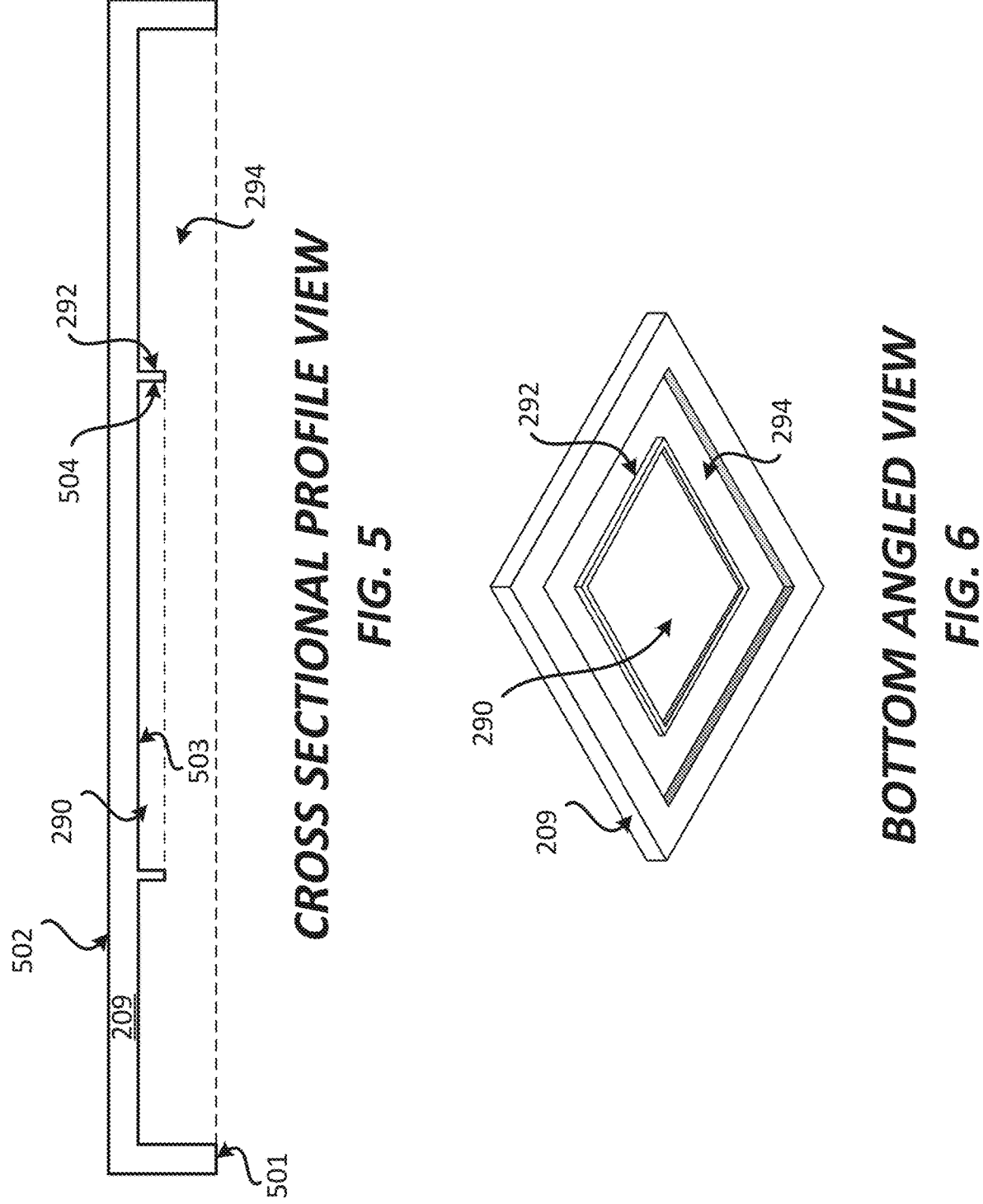
FIG. 5 illustrates a profile cross sectional view of an exemplary lid structure with a compartment.
FIG. 6 illustrates a view of an exemplary lid structure with a compartment.

FIG. 5 illustrates an exemplary profile view of the lid structure 209. The lid structure 209 includes a footing portion 501 and a top portion 502. The lid structure 209 includes at least one protrusion 292. The at least one protrusion 292 may be at least one protrusion that extend from the top portion 502. The at least one protrusion 292 may be considered to be part of the top portion 502. The lid structure 209 also includes the compartment 290. The compartment 290 is defined by an inner top surface 503 and an inner side surface 504 (e.g., side surface). The inner top surface 503 may be part of the top portion. The inner side surface 504 may be a side surface of the at least one protrusion 292. FIG. 5 also illustrates a compartment 294. The compartment 294 (e.g., second compartment) may be a space that is defined by at least the footing portion 501 (e.g., footing) of the lid structure 209. The compartment 290 may be located over the compartment 294. The compartment 290 may be configured to include a thermal interface material (e.g., 110) such that thermal interface material is coupled to the inner top surface 503 and the inner side surface 504.

The use of the compartment 290 helps improve the compression of the thermal interface material 110, which helps lower the thermal resistance of the thermal interface material 110 and helps improve the heat transfer capabilities of the thermal interface material 110. For example, the inner side surface 504 of the at least one protrusion 292 helps provide additional compression on the thermal interface material between the integrated device (e.g., 103) and the lid structure 209, which helps reduce the thermal resistance of the thermal interface material and helps increase the heat transfer capabilities of the thermal interface material between the integrated device and the lid structure.

FIG. 6 illustrates an exemplary angled view of the lid structure 209. FIG. 6 illustrates the lid structure 209 from a bottom angle and/or an inner angle. The lid structure 209 includes the compartment 290, the at least one protrusion 292 and the compartment 294. The compartment 294 may correspond and/or be similar to the compartment 260.

Figure 7:
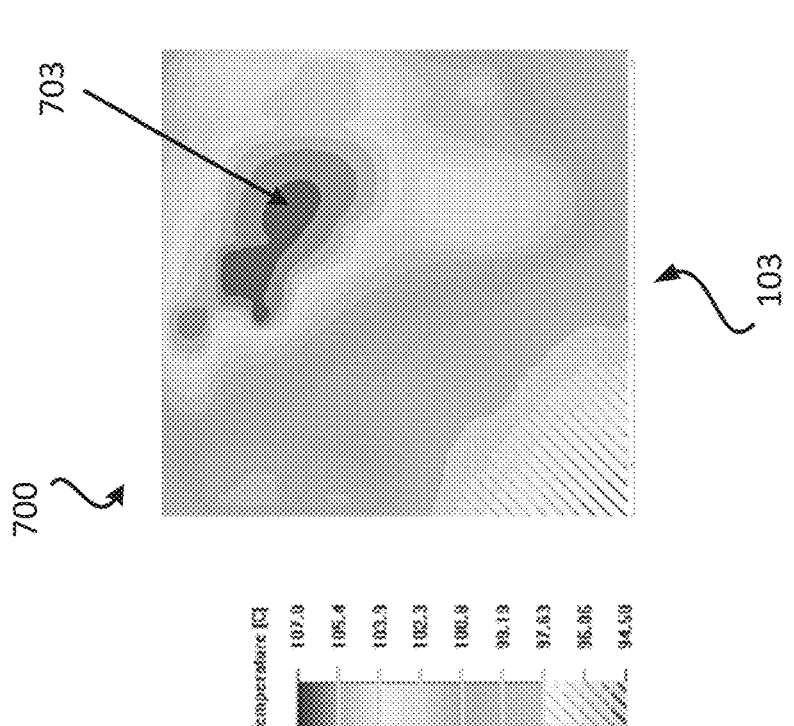
FIG. 7 illustrates a junction temperature map profile of an integrated device coupled to a lid structure without a cavity.

FIG. 7 illustrates an exemplary junction temperature map profile of an integrated device coupled to a lid structure without a cavity in the lid structure. The junction temperature map profile 700 illustrates exemplary temperatures on the front side of the integrated device 103. The junction temperature map profile 700 illustrates a spot 703 on the integrated device 103 that may be a hotspot.

Figure 8:
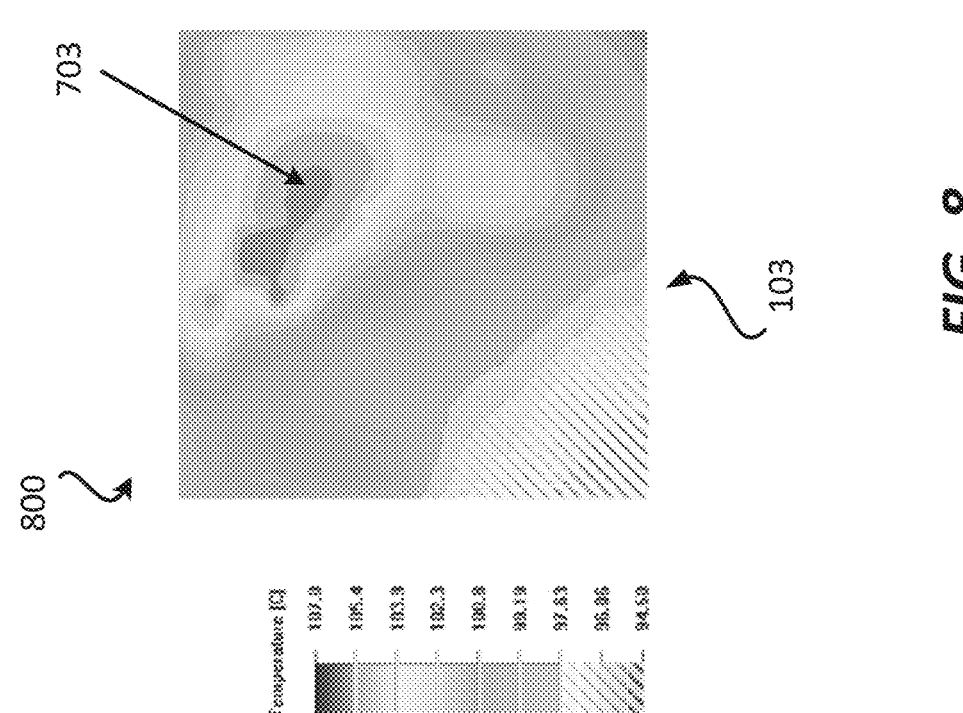
FIG. 8 illustrates a junction temperature map profile of an integrated device coupled to a lid structure with a cavity.

FIG. 8 illustrates an exemplary junction temperature map profile of an integrated device coupled to a lid structure with a cavity, such as for example, the lid structure 109. The junction temperature map profile 800 illustrates exemplary temperatures on the front side of the integrated device 103. The junction temperature map profile 800 also illustrates the spot 703 on the integrated device 103. The junction temperature map profile 800 illustrates that the spot 703 is not as hot (compared to the spot 703 on the junction temperature map profile 700). The decrease in the temperature of the spot 703 may be due to the improved heat dissipation capabilities through the use of the lid structure 109 (or the lid structure 209). It is noted that the temperature map profiles of FIGS. 7 and 8 are exemplary. Different implementations may have different temperature map profiles.

Figures 9, 10:
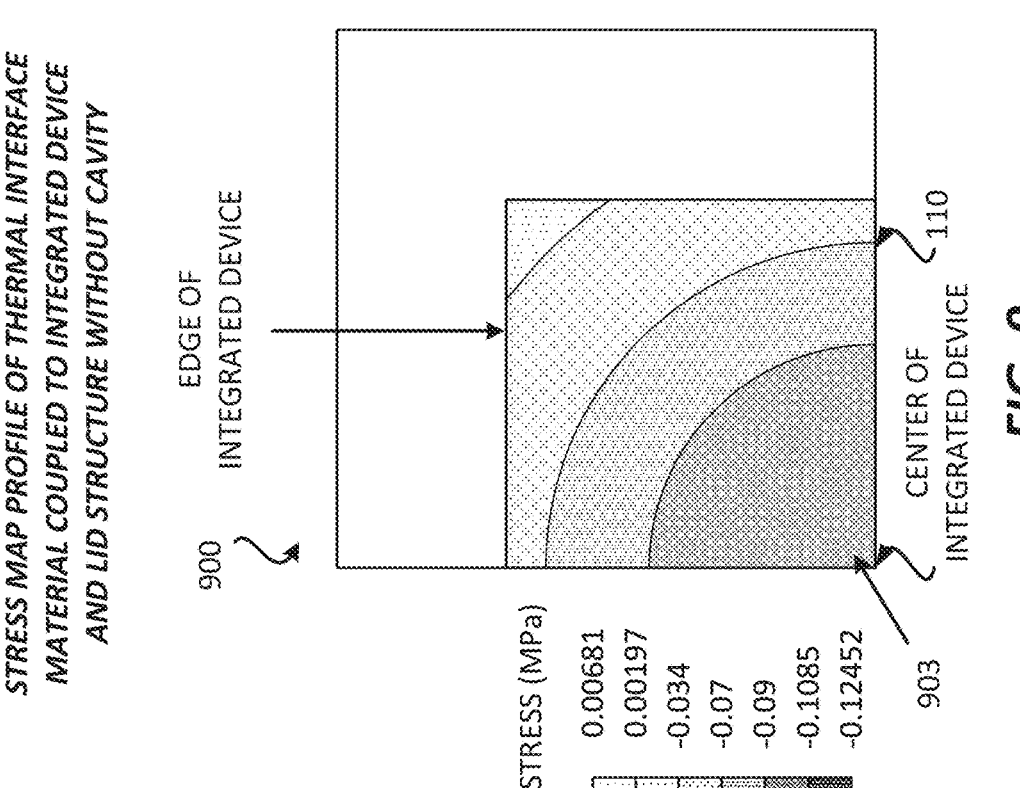
FIG. 9 illustrates a stress map profile of a thermal interface material coupled to an integrated device and to a lid structure without a cavity.
FIG. 10 illustrates a stress map profile of a thermal interface material coupled to an integrated device and to a lid structure with a cavity.

FIG. 9 illustrates an exemplary stress map profile of a quadrant of a thermal interface material coupled to an integrated device and a lid structure without a cavity in the lid structure. The stress map profile 900 illustrates exemplary stresses on a thermal interface material (e.g., 110) coupled to the back side of the integrated device 103. The stresses can include compressive stress (e.g., compression stress) and tensile stress (e.g., tension stress). Compressive stress may be represented as a negative value in the stress map profile 900, while tensile stress may be represented as positive value in the stress map profile 900. As shown in the stress map profile 900, there is compressive stress near the center of the integrated device 103 and tensile stress (or less compression stress) near the edge of the integrated device 103. The stress map profile 900 illustrates a spot 903 on the thermal interface material 110 near a center of the integrated device 103.

FIG. 10 illustrates an exemplary stress map profile of a thermal interface material coupled to an integrated device and a lid structure with a cavity, such as for example, the lid structure 109. The stress map profile 1000 illustrates exemplary stresses on a thermal interface material (e.g., 110) coupled to the back side of the integrated device 103. The stresses can include compressive stress (e.g., compression stress) and tensile stress (e.g., tension stress). Compressive stress may be represented as a negative value in the stress map profile 1000, while tensile stress may be represented as positive value in the stress map profile 1000. The stress map profile 1000 illustrates the spot 903 on the thermal interface material 110 near the center of the integrated device 103. The inner side surface of the lid structure helps increase the compression of the thermal interface material between the integrated device 103 and the lid structure 109, which helps reduce the thermal resistance of the thermal interface material and helps increase the heat transfer capabilities of the thermal interface material. FIG. 9 and FIG. 10 illustrate that the spot 903 has a greater compression of the thermal interface material when a lid structure with a cavity and/or a compartment is used, as described in at least FIGS. 1-2. This increase in compression near and/or about the center of the integrated device (and throughout the integrated device), helps improve the heat transfer capabilities of the thermal interface material, which in turns helps improve heat dissipation from the integrated device to the lid structure. It is noted that the stress map profiles of FIGS. 9 and 10 are exemplary. Different implementations may have different stress map profiles.

An integrated device (e.g., 103) may include a die (e.g., semiconductor bare die). The integrated device may include a power management integrated circuit (PMIC). The integrated device may include an application processor. The integrated device may include a modem. The integrated device may include a radio frequency (RF) device, a passive device, a filter, a capacitor, an inductor, an antenna, a transmitter, a receiver, a gallium arsenide (GaAs) based integrated device, a surface acoustic wave (SAW) filter, a bulk acoustic wave (BAW) filter, a light emitting diode (LED) integrated device, a silicon (Si) based integrated device, a silicon carbide (SiC) based integrated device, a memory, power management processor, and/or combinations thereof. An integrated device (e.g., 103, 105, 107) may include at least one electronic circuit (e.g., first electronic circuit, second electronic circuit, etc. . . . ). An integrated device may include transistors. An integrated device may be an example of an electrical component and/or electrical device. In some implementations, an integrated device may be a chiplet. A chiplet may be fabricated using a process that provides better yields compared to other processes used to fabricate other types of integrated devices, which can lower the overall cost of fabricating a chiplet. Different chiplets may have different sizes and/or shapes. Different chiplets may be configured to provide different functions. Different chiplets may have different interconnect densities (e.g., interconnects with different width and/or spacing). In some implementations, several chiplets may be used to perform the functionalities of one or more chips (e.g., one more integrated devices). Thus, for example, a single integrated device may be split into several chiplets. As mentioned above, using several chiplets that perform several functions may reduce the overall cost of a package relative to using a single chip to perform all of the functions of a package. In some implementations, one or more of the chiplets and/or one or more of integrated devices (e.g., 103) described in the disclosure may be fabricated using the same technology node or two or more different technology nodes. For example, an integrated device may be fabricated using a first technology node, and a chiplet may be fabricated using a second technology node that is not as advanced as the first technology node. In such an example, the integrated device may include components (e.g., interconnects, transistors) that have a first minimum size, and the chiplet may include components (e.g., interconnects, transistors) that have a second minimum size, where the second minimum size is greater than the first minimum size. In some implementations, an integrated device and another integrated device of a package, may be fabricated using the same technology node or different technology nodes. In some implementations, a chiplet and another chiplet of a package, may be fabricated using the same technology node or different technology nodes.

Figure 11A:
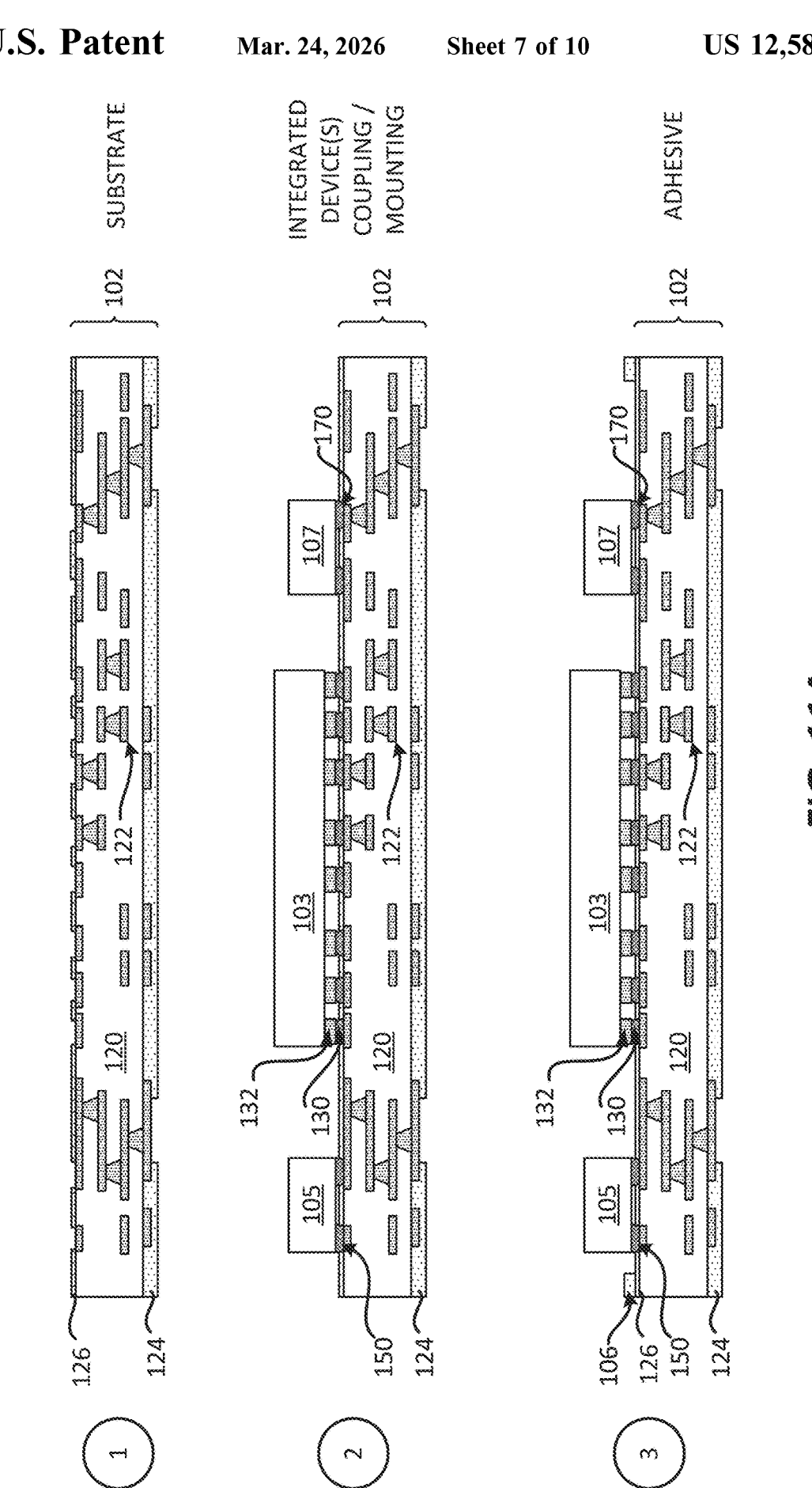
FIGS. 11A-11B illustrate an exemplary sequence for fabricating package that includes an integrated device and a lid structure with a compartment.
Figure 11B:
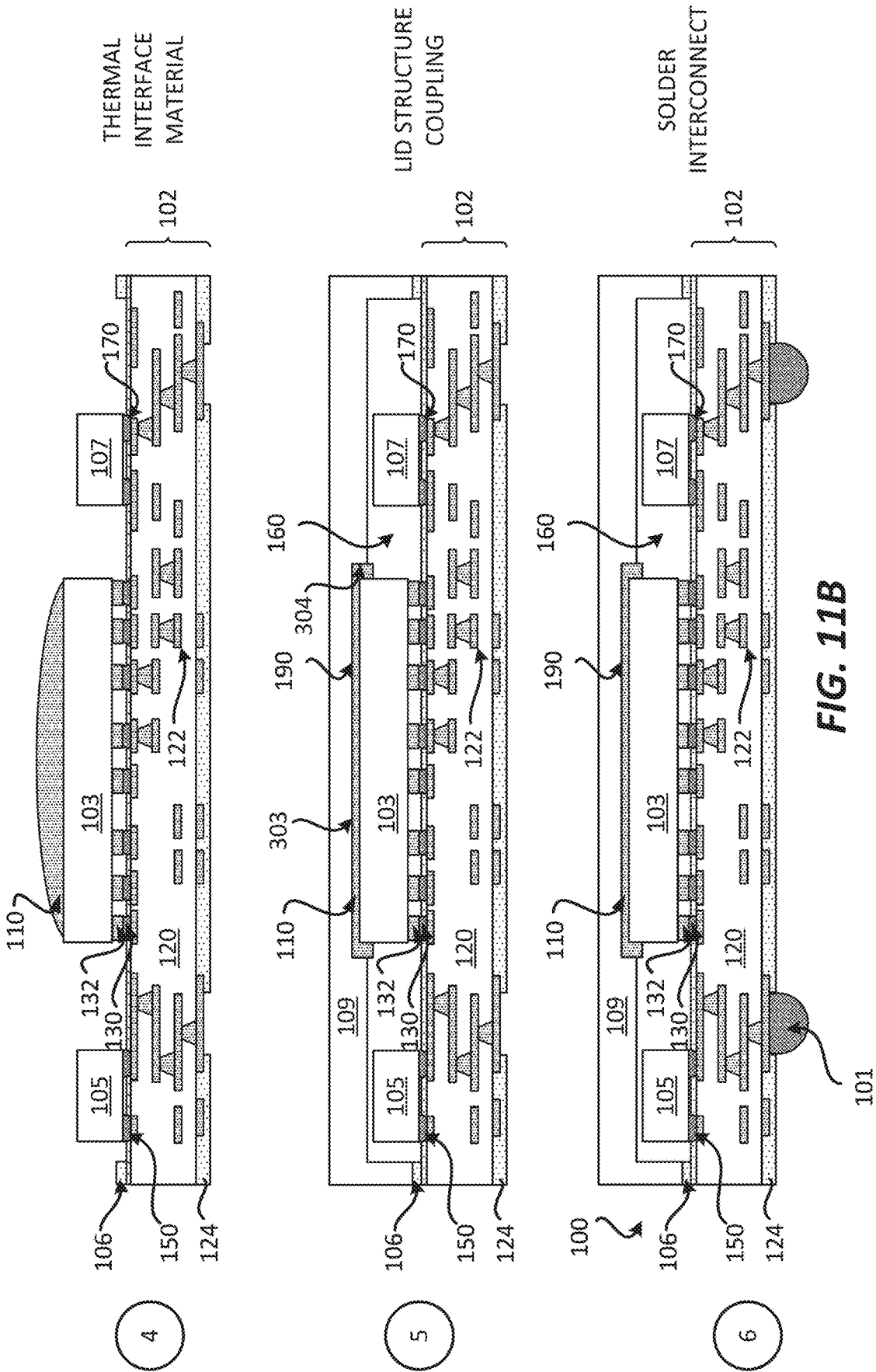

Exemplary Sequence for Fabricating a Package Comprising a Lid Structure with a Compartment In some implementations, fabricating a package includes several processes. FIGS. 11A-11B illustrate an exemplary sequence for providing or fabricating a package comprising a lid structure. In some implementations, the sequence of FIGS. 11A-11B may be used to provide or fabricate the package 100 of FIG. 1 described in the disclosure. However, the sequence may be used to provide or fabricate any of the packages (e.g., 200) described in the disclosure.

It should be noted that the sequence of FIGS. 11A-11B may combine one or more processes in order to simplify and/or clarify the method for providing or fabricating a package. In some implementations, the order of the processes may be changed or modified.

Stage 1 of FIG. 11A, illustrates a state after a substrate 102 is fabricated or provided. The substrate 102 includes at least one dielectric layer 120, a plurality of interconnects 122 and a solder resist layer 124 and a solder resist layer 126. The substrate 102 may include a first surface (e.g., top surface) and a second surface (e.g., bottom surface). The designation of the first surface of the substrate 102 and the second surface of the substrate 102 is exemplary. In some implementations, the first surface and the second surface of the substrate 102 may be switched. Different implementations may use different substrates. In some implementations, a substrate may include a laminate substrate, an embedded trace substrate, a coreless substrate and/or a cored substrate.

Stage 2 illustrates a state after the integrated device 103, the passive device 105 and the passive device 107 are coupled to the first surface of the substrate 102. The integrated device 103 may be coupled to the first surface (e.g., top surface) of the substrate 102 through a plurality of solder interconnects 130 and a plurality of pillar interconnects 132. The passive device 105 may be coupled to the first surface of the substrate 102 through a plurality of solder interconnects 150. The passive device 107 may be coupled to the first surface of the substrate 102 through a plurality of solder interconnects 170. One or more solder reflow processes may be used to couple the integrated device 103, the passive device 105 and/or the passive device 107 to the substrate 102.

Stage 3 illustrates a state after an adhesive 106 is coupled to the first surface of the substrate 102. A deposition process may be used to form and/or provide the adhesive 106 over the first surface of the substrate 102. The adhesive 106 may be formed and/or provided along a periphery of the substrate 102 and/or near the edges of the substrate 102. In some implementations, the adhesive 106 may be coupled to the solder resist layer 126. In some implementations, the adhesive 106 may be coupled to a dielectric layer of the substrate 102.

Stage 4, as shown in FIG. 11B, illustrates a state after a thermal interface material 110 is formed and/or provided over the integrated device 103. The thermal interface material 110 may be formed over the back side of the integrated device 103. A deposition process and/or injection process may be used to provide the thermal interface material 110 over the integrated device 103.

Stage 5 illustrates a state after the lid structure 109 is coupled to the substrate 102. The lid structure 109 is coupled to the substrate 102 such that the footing portion of the lid structure 109 is coupled to the substrate 102 through the adhesive 106. The footing portion of the lid structure 109 may be located along the periphery of the substrate 102. The lid structure 109 includes the compartment 190 that is located over the integrated device 103. The thermal interface material 110 is located between the integrated device 103 and the lid structure 109. The thermal interface material 110 is coupled to the back side of the integrated device 103 and the side surface of the integrated device. The thermal interface material 110 is coupled to the inner top surface (e.g., 303) of the lid structure 109 and the inner side surface (e.g., 304) of the lid structure 109. The thermal interface material 110 is located between the side surface of the integrated device 103 and the inner side surface (e.g., 304) of the lid structure 109. The inner side surface of the lid structure 109 helps provide additional compression on the thermal interface material 110, which helps reduce thermal resistance of the thermal interface material 110 and helps increase heat transfer capabilities of the thermal interface material 110. In some implementations, a portion of the side surface of the integrated device 103 and a portion of the inner side surface of the lid structure 109 may have the same horizontal plane. In some implementations, a portion of the side surface of the integrated device 103, a portion of the thermal interface material 110 and a portion of the inner side surface of the lid structure 109 may have the same horizontal plane. It is noted that in some implementations, the thermal interface material 110 may be provided in the compartment 190 of the lid structure 109, and the lid structure 109 is coupled to the substrate 102 such that the lid structure 109 is also coupled to the integrated device 103 through the thermal interface material 110. In such instance, the forming of the thermal interface material 110 at Stage 4 before the coupling of the lid structure 109 may be optional. Instead of the lid structure 109, the lid structure 209 may be coupled to the substrate 102 at stage 5.

Stage 6 illustrates a state after a plurality of solder interconnects 101 are coupled to a second surface of the substrate 102. A solder reflow process may be used to couple the plurality of solder interconnects 101 to the substrate 102.

Exemplary Flow Diagram of a Method for Package Comprising a Lid Structure with a Compartment In some implementations, fabricating a package includes several processes. FIG. 12 illustrates an exemplary flow diagram of a method 1200 for providing or fabricating a package comprising a lid structure. In some implementations, the method 1200 of FIG. 12 may be used to provide or fabricate the package 100 of FIG. 1 described in the disclosure. However, the method 1200 may be used to provide or fabricate any of the packages (e.g., 200) described in the disclosure.

It should be noted that the method of FIG. 12 may combine one or more processes in order to simplify and/or clarify the method for providing or fabricating a package. In some implementations, the order of the processes may be changed or modified.

The method provides (at 1205) a substrate (e.g., 102) that includes at least one dielectric layer and a plurality of interconnects. Stage 1 of FIG. 11A, illustrates and describes an example of a substrate that is fabricated or provided. The substrate 102 includes at least one dielectric layer 120, a plurality of interconnects 122 and a solder resist layer 124. The substrate 102 may include a first surface (e.g., top surface) and a second surface (e.g., bottom surface). The designation of the first surface of the substrate 102 and the second surface of the substrate 102 is exemplary. In some implementations, the first surface and the second surface of the substrate 102 may be switched.

The method couples (at 1210) at least one integrated device and/or at least one passive device to the first surface of the substrate (e.g., 102). Stage 2 of FIG. 11A illustrates and describes an example of the integrated device 103, the passive device 105 and the passive device 107 that are coupled to the first surface of the substrate 102. The integrated device 103 may be coupled to the first surface of the substrate 102 through a plurality of solder interconnects 130 and a plurality of pillar interconnects 132. The passive device 105 may be coupled to the first surface of the substrate 102 through a plurality of solder interconnects 150. The passive device 107 may be coupled to the first surface of the substrate 102 through a plurality of solder interconnects 170. One or more solder reflow processes may be used to couple the integrated device 103, the passive device 105 and/or the passive device 107 to the substrate 102.

The method forms and couples (at 1215) an adhesive to the substrate. Stage 3 of FIG. 11A illustrates and describes an example of an adhesive 106 that is coupled to the first surface of the substrate 102. A deposition process and/or an injection process may be used to form the adhesive 106 over the first surface of the substrate 102. The adhesive 106 may be formed along a periphery of the substrate 102 and/or near the edges of the substrate 102. In some implementations, the adhesive 106 may be coupled to the solder resist layer 126. In some implementations, the adhesive 106 may be coupled to a dielectric layer of the substrate 102.

The method forms (at 1220) a thermal interface material over a back side of an integrated device. Stage 4 of FIG. 11B, illustrates and describes an example of a thermal interface material 110 that is formed over the integrated device 103. The thermal interface material 110 may be formed over the back side of the integrated device 103. A deposition process and/or an injection process may be used to provide the thermal interface material 110 over the integrated device 103.

The method couples (at 1225) a lid structure to the substrate, where the lid structure is coupled to the substrate through the adhesive. The lid structure includes a first compartment comprising a side surface and an inner top surface, and where a thermal interface material is coupled to the side and inner top surfaces of the first compartment of the lid structure. Stage 5 of FIG. 11B illustrates and describes an example of the lid structure 109 that is coupled to the substrate 102. The lid structure 109 is coupled to the substrate 102 such that the footing portion of the lid structure 109 is coupled to the substrate 102 through the adhesive 106. The footing portion of the lid structure 109 may be located along the periphery of the substrate 102. The lid structure 109 includes the compartment 190 that is located over the integrated device 103. The thermal interface material 110 is located between the integrated device 103 and the lid structure 109. The thermal interface material 110 is coupled to the back side of the integrated device 103 and the side surface of the integrated device. The thermal interface material 110 is coupled to the inner top surface (e.g., 303) of the lid structure 109 and the inner side surface (e.g., 304) of the lid structure 109. The thermal interface material 110 may be located in the compartment 190. The thermal interface material 110 is located between the side surface of the integrated device 103 and the inner side surface (e.g., 304) of the lid structure 109. The inner side surface of the lid structure 109 helps provide additional compression on the thermal interface material 110, which helps reduce thermal resistance of the thermal interface material 110 and helps increase heat transfer capabilities of the thermal interface material 110. In some implementations, a portion of the side surface of the integrated device 103 and a portion of the inner side surface of the lid structure 109 may have the same horizontal plane. In some implementations, a portion of the side surface of the integrated device 103, a portion of the thermal interface material 110 and a portion of the inner side surface of the lid structure 109 may have the same horizontal plane. Instead of the lid structure 109, the lid structure 209 may be coupled (at 1225) to the substrate 102.

The method couples (at 1230) a plurality of solder interconnects to the substrate. Stage 6 of FIG. 11B illustrates and describes an example of a plurality of solder interconnects 101 that are coupled to a second surface of the substrate 102. A solder reflow process may be used to couple the plurality of solder interconnects 101 to the substrate 102.

Exemplary Electronic Devices

Figure 13:
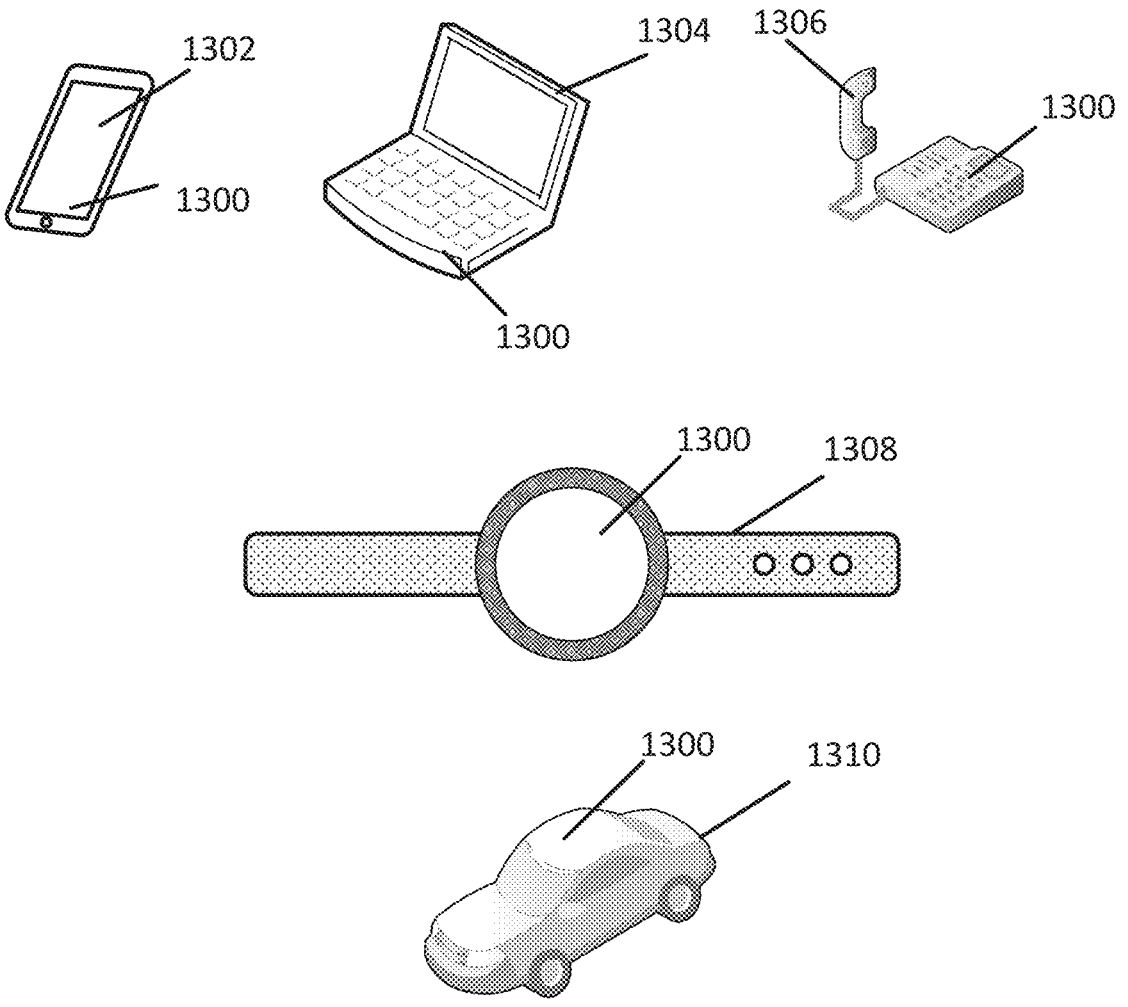
FIG. 13 illustrates various electronic devices that may integrate a die, an electronic circuit, an integrated device, an integrated passive device (IPD), a passive component, a package, and/or a device package described herein.

FIG. 13 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 1302, a laptop computer device 1304, a fixed location terminal device 1306, a wearable device 1308, or automotive vehicle 1310 may include a device 1300 as described herein. The device 1300 may be, for example, any of the devices and/or integrated circuit (IC) packages described herein. The devices 1302, 1304, 1306 and 1308 and the vehicle 1310 illustrated in FIG. 13 are merely exemplary. Other electronic devices may also feature the device 1300 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IOT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 1-6, 11A-11B and/or 12-13 may be rearranged and/or combined into a single component, process, feature or function or embodied in several components, processes, or functions. Additional elements, components, processes, and/or functions may also be added without departing from the disclosure. It should also be noted FIGS. 1-6, 11A-11B and/or 12-13 and its corresponding description in the present disclosure is not limited to dies and/or ICs. In some implementations, FIGS. 1-6, 11A-11B and/or 12-13 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (POP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another—even if they do not directly physically touch each other. An object A, that is coupled to an object B, may be coupled to at least part of object B. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The terms "encapsulate", "encapsulating" and/or any derivation means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. A value that is about X-XX, may mean a value that is between X and XX, inclusive of X and XX. The value(s) between X and XX may be discrete or continuous. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a metallization layer, a redistribution layer, and/or an under bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. An interconnect may include one or more metal layers. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the disclosure.

Aspect 1: A package comprising a substrate, a first integrated device coupled to a first surface of the substrate, a lid structure coupled to the substrate, wherein the lid structure includes a first compartment comprising a side surface and an inner top surface, and a thermal interface material coupled to (i) the first integrated device and (ii) the side surface and the inner top surface of the first compartment of the lid structure. The substrate includes at least one dielectric layer and a plurality of interconnects.

Aspect 2: The package of aspect 1, wherein the first compartment includes a cavity in the lid structure.

Aspect 3: The package of aspects 1 through 2, wherein the lid structure includes at least one protrusion, and wherein the first compartment is defined by the at least one protrusion of the lid structure.

Aspect 4: The package of aspect 3, wherein the side surface of the first compartment is a side surface of the at least one protrusion of the lid structure.

Aspect 5: The package of aspects 1 through 4, wherein the first compartment of the lid structure laterally surrounds only the integrated device and the thermal interface material.

Aspect 6: The package of aspects 1 through 4, further comprising at least one passive device coupled to the first surface of the substrate, wherein the lid structure includes a second compartment that laterally surrounds the integrated device and the at least one passive device, and wherein the first compartment of the lid structure laterally surrounds only the integrated device and the thermal interface material.

Aspect 7: The package of aspects 1 through 6, wherein the thermal interface material is coupled to a back side of the integrated device and a side surface of the integrated device.

Aspect 8: The package of aspects 1 through 7, wherein the lid structure includes metal.

Aspect 9: The package of aspects 1 through 8, wherein the package includes an adhesive coupled to the first surface of the substrate, and wherein the lid structure is coupled to the substrate through the adhesive.

Aspect 10: The package of aspects 1 through 9, wherein the lid structure includes a top portion and a footing portion, and wherein the lid structure is coupled to the substrate such that the footing portion is located over a periphery portion of the substrate.

Aspect 11: A device comprising a package that includes a substrate, a first integrated device coupled to a first surface of the substrate, a lid structure coupled to the substrate, wherein the lid structure includes a first compartment comprising a side surface and an inner top surface, and a thermal interface material coupled to (i) the first integrated device and (ii) the side surface and the inner top surface of the first compartment of the lid structure. The substrate comprises at least one dielectric layer and a plurality of interconnects.

Aspect 12: The device of aspect 11, wherein the first compartment includes a cavity in the lid structure.

Aspect 13: The device of aspects 11 through 12, wherein the lid structure includes at least one protrusion, wherein the first compartment is defined by the at least one protrusion of the lid structure, and wherein the side surface of the first compartment is a side surface of the at least one protrusion of the lid structure.

Aspect 14: The device of aspect 11 through 13, wherein the thermal interface material is coupled to a back side of the integrated device and a side surface of the integrated device.

Aspect 15: The device of aspects 11 through 14, wherein the device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IOT) device, and a device in an automotive vehicle.

Aspect 16: A method for fabricating a package. The method provides a substrate comprising at least one dielectric layer and a plurality of interconnects. The method couples a first integrated device to a first surface of the substrate. The method couples a lid structure to the substrate, where the lid structure includes a first compartment comprising a side surface and an inner top surface. Coupling the lid structure comprises coupling the lid structure to the first integrated device through a thermal interface material. The thermal interface material is coupled to the side surface and the inner top surface of the first compartment of the lid structure.

Aspect 17: The method of aspect 16, wherein the thermal interface material is coupled to a back side of the integrated device and a side surface of the integrated device.

Aspect 18: The method of aspects 16 through 17, wherein the first compartment includes a cavity in the lid structure.

Aspect 19: The method of aspects 16 through 18, wherein the lid structure includes at least one protrusion, and wherein the first compartment is defined by the at least one protrusion of the lid structure.

Aspect 20: The method of aspects 16 through 19, wherein the thermal interface material is coupled to the integrated device before coupling the lid structure to the substrate, and/or wherein the thermal interface material is coupled to the lid structure before coupling the lid structure to the substrate.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A package comprising:
   a substrate comprising:
      at least one dielectric layer; and
      a plurality of interconnects;
   a first integrated device coupled to a first surface of the substrate;
   a lid structure coupled to the substrate, wherein the lid structure includes a first compartment comprising a side surface and an inner top surface,
   wherein the first compartment vertically overlaps with the first integrated device, and
   wherein the side surface of the first compartment laterally surrounds a portion of the first integrated device; and
   a thermal interface material coupled to and touching (i) a back side of the first integrated device, (ii) a side surface of the first integrated device, and (iii) the side surface and the inner top surface of the first compartment of the lid structure.

2. The package of claim 1, wherein the first compartment includes a cavity in the lid structure.

3. The package of claim 1, wherein the lid structure includes at least one protrusion, and wherein the first compartment is defined by the at least one protrusion of the lid structure.

4. The package of claim 3, wherein the side surface of the first compartment is a side surface of the at least one protrusion of the lid structure.

5. The package of claim 1, wherein the first compartment of the lid structure laterally surrounds only the first integrated device and the thermal interface material.

6. The package of claim 1, further comprising at least one passive device coupled to the first surface of the substrate, wherein the lid structure includes a second compartment that laterally surrounds the first integrated device and the at least one passive device, and wherein the first compartment of the lid structure laterally surrounds only the first integrated device and the thermal interface material.

7. The package of claim 1, wherein the lid structure includes metal.

8. The package of claim 1, wherein the package includes an adhesive coupled to the first surface of the substrate, and wherein the lid structure is coupled to the substrate through the adhesive.

9. The package of claim 1, wherein the lid structure includes a top portion and a footing portion, and wherein the lid structure is coupled to the substrate such that the footing portion is located over a periphery portion of the substrate.

10. A device comprising:

a package comprising:

a substrate comprising:

at least one dielectric layer; and a plurality of interconnects;

a first integrated device coupled to a first surface of the substrate;

a lid structure coupled to the substrate, wherein the lid structure includes a first compartment comprising a side surface and an inner top surface, wherein the first compartment vertically overlaps with the first integrated device, and wherein the side surface of the first compartment laterally surrounds a portion of the first integrated device; and a thermal interface material coupled to and touching (i) a back side of the first integrated device, (ii) a side surface of the first integrated device and (iii) the side surface and the inner top surface of the first compartment of the lid structure.

11. The device of claim 10, wherein the first compartment includes a cavity in the lid structure.

12. The device of claim 10, wherein the lid structure includes at least one protrusion, and wherein the first compartment is defined by the at least one protrusion of the lid structure, and wherein the side surface of the first compartment is a side surface of the at least one protrusion of the lid structure.

13. The device of claim 10, wherein the device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

14. A method for fabricating a package, comprising:

providing a substrate comprising:

at least one dielectric layer; and a plurality of interconnects;

coupling a first integrated device to a first surface of the substrate;

coupling a lid structure to the substrate, wherein the lid structure includes a first compartment comprising a side surface and an inner top surface, wherein the first compartment vertically overlaps with the first integrated device, and wherein the side surface of the first compartment laterally surrounds a portion of the first integrated device; and wherein coupling the lid structure comprises coupling the lid structure to the first integrated device through a thermal interface material, and wherein the thermal interface material is coupled to and touching (i) a back side of the first integrated device, (ii) a side surface of the first integrated device and (iii) the side surface and the inner top surface of the first compartment of the lid structure.

15. The method of claim 14, wherein the first compartment includes a cavity in the lid structure.

16. The method of claim 14, wherein the lid structure includes at least one protrusion, and wherein the first compartment is defined by the at least one protrusion of the lid structure.

17. The method of claim 14, wherein the thermal interface material is coupled to the first integrated device before coupling the lid structure to the substrate, and/or wherein the thermal interface material is coupled to the lid structure before coupling the lid structure to the substrate.

* * * * *